(12) United States Patent
Hsiao et al.

(10) Patent No.: US 12,733,223 B2
(45) Date of Patent: Sep. 8, 2026

(54) SEMICONDUCTOR DEVICE AND MANUFACTURING METHOD THEREOF

(71) Applicants: HON HAI PRECISION INDUSTRY CO., LTD., New Taipei City (TW); Hon Young Semiconductor Corporation, Hsinchu City (TW)

(72) Inventors: Yi-Kai Hsiao, New Taipei City (TW); Wen-Cheng Hsu, New Taipei City (TW); Kuang-Hao Chiang, New Taipei City (TW); Hao-Chung Kuo, New Taipei City (TW)

(73) Assignees: HON HAI PRECISION INDUSTRY CO., LTD., New Taipei City (TW); Hon Young Semiconductor Corporation, Hsinchu City (TW)

( * ) Notice: Subject to any disclaimer, the term of this patent is extended or adjusted under 35 U.S.C. 154(b) by 265 days.

(21) Appl. No.: 18/344,896

(22) Filed: Jun. 30, 2023

(65) Prior Publication Data

US 2024/0006486 A1 Jan. 4, 2024

(30) Foreign Application Priority Data

Jun. 30, 2022 (TW) ................................ 111124596

(51) Int. Cl.
*H10D 62/10* (2025.01)
*H10D 30/01* (2025.01)
*H10D 30/66* (2025.01)

(52) U.S. Cl.
CPC ....... *H10D 62/124* (2025.01); *H10D 30/0293* (2025.01); *H10D 30/66* (2025.01)

(58) Field of Classification Search
CPC .......... H10D 30/0291; H10D 30/0293; H10D 30/66–669; H10D 62/124;
(Continued)

(56) References Cited

U.S. PATENT DOCUMENTS 5,023,191 A 6/1991 Sakurai et al.
5,164,327 A 11/1992 Maruyama et al.
(Continued)

FOREIGN PATENT DOCUMENTS

CN 103681326 A 3/2014
CN 106128951 A 11/2016
(Continued)

*Primary Examiner* — Scott B Geyer
(74) *Attorney, Agent, or Firm* — CKC & Partners Co., LLC

(57) ABSTRACT

A method of forming a semiconductor device includes forming a P-type heavily doped region in a substrate. A sacrificial layer is formed on the substrate and covers the P-type heavily doped region. The sacrificial layer is patterned, so that sidewalls of the sacrificial layer are above the substrate inside the P-type heavily doped region. An N-type heavily doped region adjacent to the P-type heavily doped region is formed in the substrate by using the sacrificial layer as mask. A wet etching process is performed to retract the sidewalls of the sacrificial layer to the substrate inside the N-type heavily doped region. A P-type lightly doped region is formed in the substrate by using the sacrificial layer as mask. The P-type lightly doped region is adjacent to the N-type heavily doped region, and is in contact with bottoms of the P-type heavily doped region and the N-type heavily doped region.

14 Claims, 12 Drawing Sheets

(58) Field of Classification Search
CPC .......... H10D 62/156–159; H10D 62/152–155; H10P 30/00–206; H10P 30/21–212
See application file for complete search history.

(56) References Cited

U.S. PATENT DOCUMENTS

| | | | | |
|---|---|---|---|---|
| 5,444,002 | A | 8/1995 | Yang | |
| 7,074,643 | B2 | 7/2006 | Ryu | |
| 11,631,762 | B1 * | 4/2023 | Potera | H10D 62/8325 257/77 |
| 2008/0090383 | A1 * | 4/2008 | Nakamura | H10P 30/2042 257/E21.057 |
| 2009/0042375 | A1 * | 2/2009 | Sawada | H10D 30/66 438/522 |
| 2009/0186470 | A1 * | 7/2009 | Takahashi | H10D 8/051 257/E21.054 |
| 2010/0035420 | A1 | 2/2010 | Tamaso et al. | |
| 2013/0189819 | A1 * | 7/2013 | Eguchi | H10D 30/0297 438/270 |
| 2014/0045322 | A1 * | 2/2014 | Tamaso | H10P 14/2904 438/478 |
| 2014/0183561 | A1 * | 7/2014 | Shimizu | H10D 62/153 257/77 |
| 2014/0210008 | A1 * | 7/2014 | Oritsuki | H10D 89/611 438/237 |
| 2014/0284622 | A1 * | 9/2014 | Shimizu | H10D 30/66 257/77 |
| 2015/0380498 | A1 * | 12/2015 | Tanaka | H10D 30/66 438/508 |
| 2016/0133707 | A1 * | 5/2016 | Kubota | H10D 62/8325 257/77 |
| 2019/0157448 | A1 * | 5/2019 | Takashima | H10D 30/668 |
| 2019/0296146 | A1 * | 9/2019 | Shimizu | H10D 30/665 |
| 2020/0279947 | A1 * | 9/2020 | Yamamoto | H10D 30/66 |
| 2021/0104607 | A1 * | 4/2021 | Tanaka | H10D 62/8503 |
| 2021/0288158 | A1 * | 9/2021 | Shimizu | B60L 15/007 |
| 2021/0335605 | A1 | 10/2021 | Wang et al. | |
| 2022/0085173 | A1 * | 3/2022 | Noguchi | H10D 30/668 |
| 2022/0384565 | A1 * | 12/2022 | Sundaresan | H10D 30/66 |
| 2023/0215943 | A1 * | 7/2023 | Yang | H10D 30/668 257/330 |
| 2023/0282744 | A1 * | 9/2023 | Sundaresan | H10D 30/601 |
| 2025/0095992 | A1 * | 3/2025 | Li | H10D 62/8325 |

FOREIGN PATENT DOCUMENTS

| | | | |
|---|---|---|---|
| CN | 111276389 | A | 6/2020 |
| CN | 112750912 | A | 5/2021 |
| JP | H02281758 | A | 11/1990 |
| TW | 561624 | B | 11/2003 |
| TW | I325180 | B | 5/2010 |

* cited by examiner

SEMICONDUCTOR DEVICE AND MANUFACTURING METHOD THEREOF

CROSS-REFERENCE TO RELATED APPLICATION

This application claims priority to Taiwan Application Serial Number 111124596, filed Jun. 30, 2022, which is herein incorporated by reference in its entirety.

BACKGROUND

Field of Invention

The present disclosure relates to a semiconductor device and a manufacturing method thereof.

Description of Related Art

Silicon carbide power transistors have characteristics of high blocking voltage, low on-resistance, and high thermal conductivity, so that the silicon carbide power transistors get more and more attention. Resistance of the silicon carbide power transistors may be composed of different components in the transistors, such as contact, channel, gate, epitaxial layer, and substrate. The resistance of the channel accounts for a large apportion of the resistance of the silicon carbide power transistors.

SUMMARY

Some embodiments of the present disclosure provide a method of forming a semiconductor device, including forming a photoresist layer on a substrate. A P-type heavily doped region is formed in the substrate by using the photoresist layer as mask. A sacrificial layer is formed on the substrate and covers the P-type heavily doped region. A first wet etching process is performed to pattern the sacrificial layer, so that a sidewall of the sacrificial layer is above the substrate inside the P-type heavily doped region. An N-type heavily doped region is formed in the substrate by using the sacrificial layer as mask, in which the N-type heavily doped region is adjacent to the P-type heavily doped region. A second wet etching process is performed to retract the sidewall of the sacrificial layer to the substrate inside the N-type heavily doped region. A P-type lightly doped region is formed in the substrate by using the sacrificial layer as mask, in which the P-type lightly doped region is adjacent to the N-type heavily doped region, and is in contact with a bottom of the P-type heavily doped region and a bottom of the N-type heavily doped region, and the sacrificial layer is removed.

In some embodiments, during performing the second wet etching process, a duration of the second wet etching process is controlled based on a retraction length of the sidewall of the sacrificial layer.

In some embodiments, forming a sacrificial layer on the substrate includes forming a first dielectric layer on the substrate, and forming a second dielectric layer on the first dielectric layer, in which the first dielectric layer and the second dielectric layer are made of different materials.

In some embodiments, performing the first wet etching process to retract the sidewall of the sacrificial layer includes retracting a sidewall of the second dielectric layer to above the substrate inside the P-type heavily doped region.

In some embodiments, during forming the P-type lightly doped region, a dopant penetrates the first dielectric layer and is implanted into the substrate.

In some embodiments, during forming the N-type heavily doped region, a dopant penetrates the first dielectric layer and is implanted into the substrate.

In some embodiments during the first wet etching process, the first dielectric layer is in place and a wet etchant in the first wet etching process does not etch the substrate.

In some embodiments a retraction length of the second dielectric layer of the sacrificial layer is between about 200 nm and 2000 nm.

In some embodiments during the second wet etching process, the first dielectric layer is in place and a wet etchant in the second wet etching process does not etch the substrate.

In some embodiments a wet etchant used in the first wet etching process is same as a wet etchant used in the second etching process.

In some embodiments, the method further includes forming a dielectric layer on the substrate, and forming a conductive layer on the dielectric layer.

In some embodiments, the method further includes patterning the dielectric layer and the conductive layer to form a gate dielectric layer and a gate layer on the substrate, in which the gate dielectric layer is in contact with the N-type heavily doped region.

In some embodiments, the method further includes forming a source contact in contact with the P-type heavily doped region and the N-type heavily doped region, and forming a drain electrode under the substrate.

In some embodiments, the method further includes performing an annealing process to the P-type heavily doped region, the N-type heavily doped region and the P-type lightly doped region after removing the sacrificial layer.

Some embodiments of the present disclosure provide a semiconductor device, including a substrate, a P-type heavily doped region in the substrate, an N-type heavily doped region in the substrate and adjacent to the P-type lightly doped region, a P-type lightly doped region in the substrate and cladding the P-type heavily doped region and the N-type heavily doped region, a gate dielectric layer covering a portion of the P-type lightly doped region; and a gate layer on the gate dielectric layer.

In some embodiments, the P-type lightly doped region includes a channel region, wherein the channel region is adjacent to the N-type heavily doped region, and a width of the N-type heavily doped region is between 200 nm to 2000 nm.

In some embodiments, the channel region is in contact with a lateral boundary of the N-type heavily doped region.

In some embodiments, the P-type lightly doped region is in contact with a bottom of the P-type heavily doped region and a bottom of the N-type heavily doped region.

In some embodiments, the semiconductor device further includes a source contact in contact with the P-type heavily doped region and the N-type heavily doped region, and a drain electrode under the substrate.

In some embodiments, the substrate includes a heavily doped layer; and an epitaxial layer on the heavily doped layer, in which a carrier concentration of the heavily doped layer is higher than an ion concentration of the epitaxial layer.

As mentioned above, the channel region of the P-type lightly doped region is controlled by controlling the retraction level of the sacrificial layer to precisely define the length of the channel region, thereby reducing the resistance of the semiconductor device.

It is to be understood that both the foregoing general description and the following detailed description are by examples, and are intended to provide further explanation of the description as claimed.

DETAILED DESCRIPTION

Some embodiments of the present disclosure are related to methods of reducing the resistance of semiconductor devices, such as transistors. Channel length of the semiconductor devices is precisely defined by precisely controlling duration of a wet etching process. Therefore, limit value of the channel length is precisely defined to reduce the resistance of the semiconductor devices.

Figure 1:
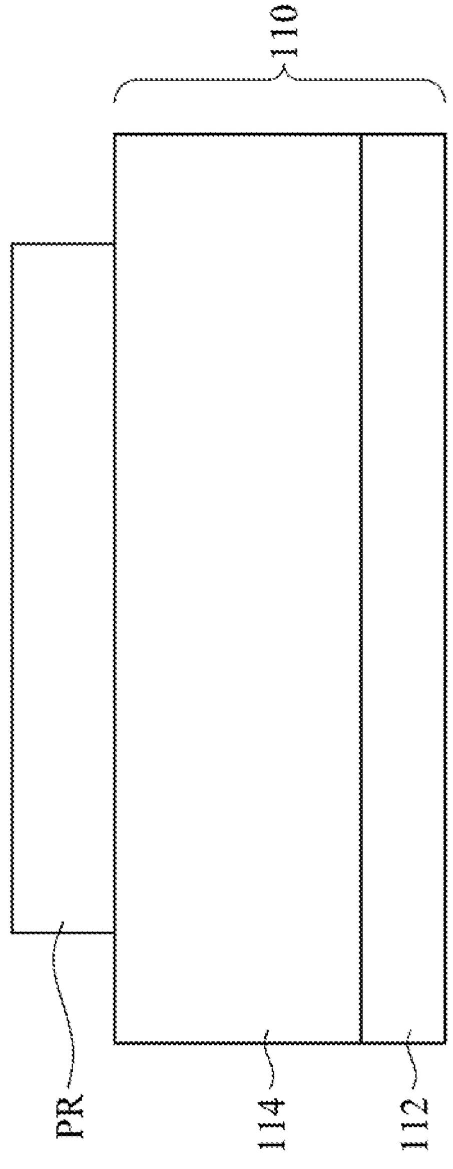
FIGS. 1-12 illustrate cross-section views of intermediate stages of a manufacturing process of a semiconductor device in some embodiments of the present disclosure.

FIGS. 1-12 illustrate cross-section views of intermediate stages of a manufacturing process of a semiconductor device in some embodiments of the present disclosure. Referring to FIG. 1, a photoresist layer PR is formed on a substrate 110. Specifically, the substrate 110 includes a heavily doped layer 112 and an epitaxial layer 114 on the heavily doped layer 112. The substrate 110 may be made of any suitable materials. In some embodiments, the substrate 110 is made of silicon carbide. The heavily doped layer 112 and the epitaxial layer 114 may be formed by performing an epitaxial process to the substrate 110. The heavily doped layer 112 and the epitaxial layer 114 may include dopant with same conductivity type (such as both N-type or both P-type), and carrier concentration of the heavily doped layer 112 is higher than ion concentration of the epitaxial layer 114. In some embodiments, the heavily doped layer 112 and the epitaxial layer 114 are both N-type doped regions. Subsequently, the photoresist layer PR is formed on the substrate 110, and the photoresist layer PR exposes a portion of the substrate 110.

Figure 2:
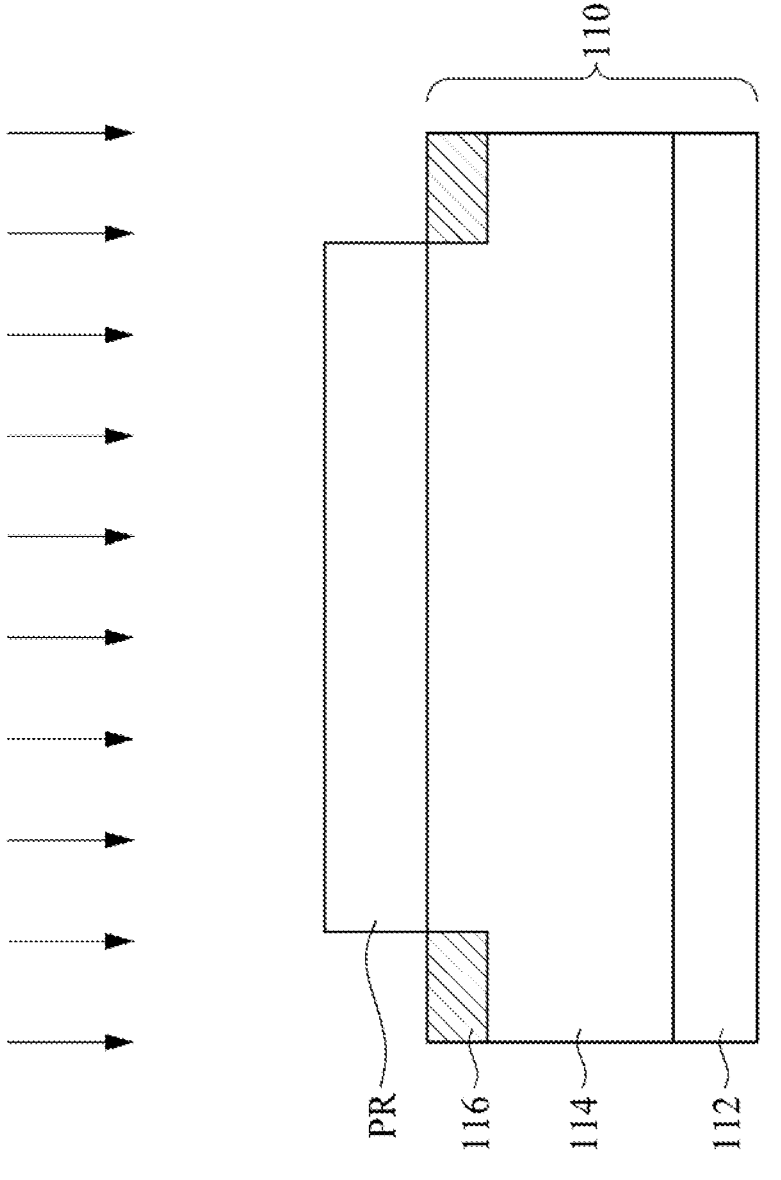

Referring to FIG. 2, P-type heavily doped regions 116 are formed in the substrate 110 by using the photoresist layer PR as mask. Specifically, a P-type heavy implantation is performed to the substrate 110 to form P-type heavily doped regions 116 in the substrate 110. The boundary of the P-type heavily doped region 116 may be substantially aligned with the sidewall of the photoresist layer PR. After performing P-type heavy implantation, the photoresist layer PR on the substrate 110 is removed. In some embodiments, the doping concentration of the P-type heavily doped region 116 is higher than the doping concentration of the epitaxial layer 114.

Figure 3:
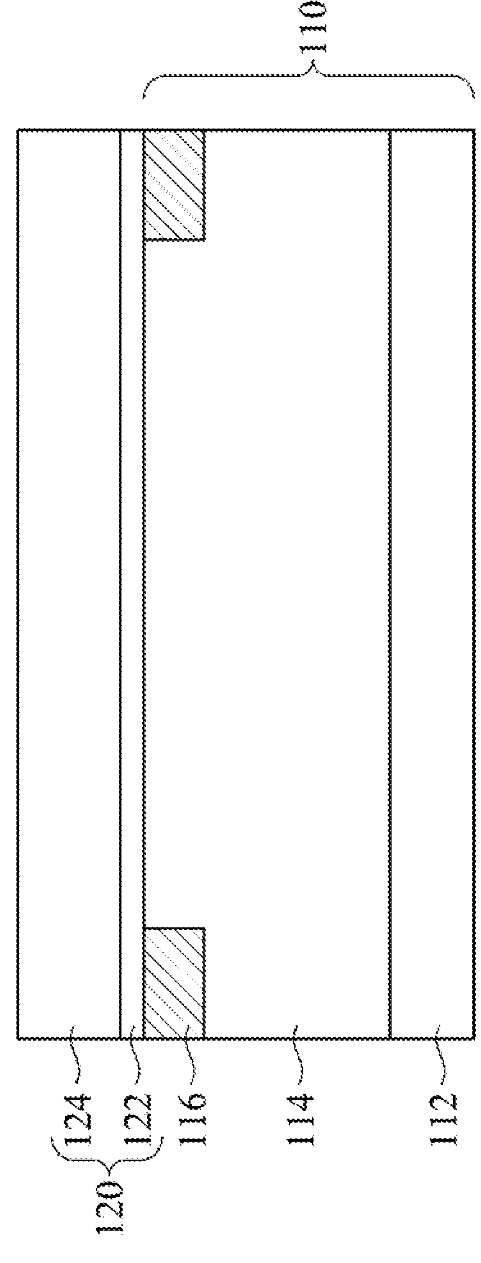

Referring to FIG. 3, after removing the photoresist layer PR, a sacrificial layer 120 is formed on the substrate 110 and covers the P-type heavily doped regions 116. In some embodiments, the photoresist layer PR may be removed by ashing, etching or other methods. In some embodiments, sacrificial layer 120 may be a multilayer. For example, forming a sacrificial layer 120 on the substrate 110 includes forming a first dielectric layer 122 on the substrate, and forming a second dielectric layer 124 on the first dielectric layer 122. The first dielectric layer 122 and the second dielectric layer 124 are made of different materials. In some embodiments, the first dielectric layer 122 is made of oxide (such as silicon dioxide), and the second dielectric layer 124 is made of nitride (such as silicon nitride). It is noted that although FIG. 3 illustrates that the sacrificial layer 120 is a multilayer, the sacrificial layer 120 may be a single layer in some embodiments. For example, the sacrificial layer 120 may be a silicon dioxide layer or a silicon nitride layer. In some embodiments, the thickness of the second dielectric layer 124 is greater than the thickness of the first dielectric layer 122.

Figure 4:
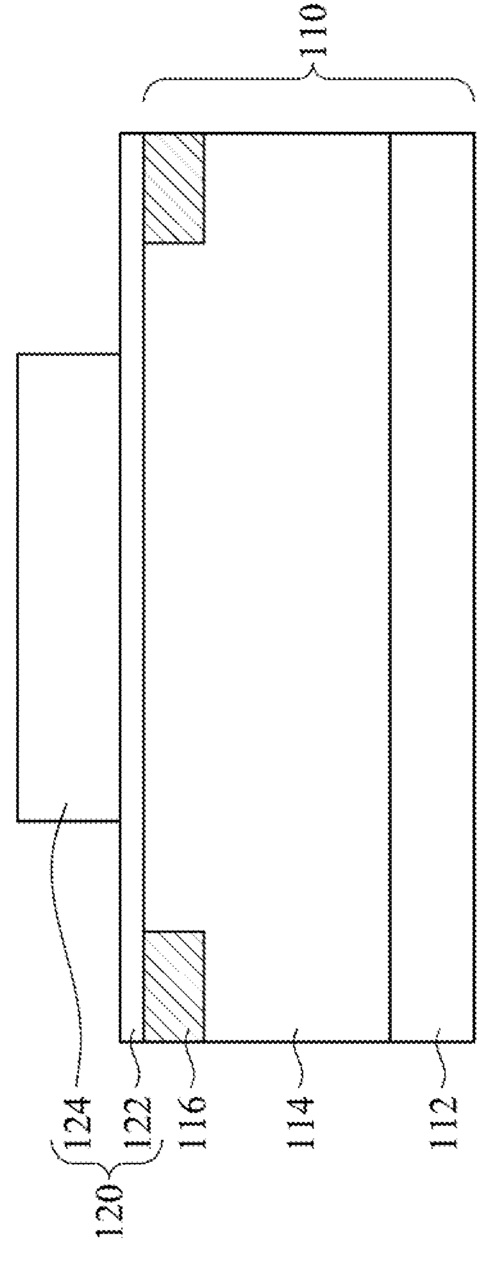

Referring to FIG. 4, a first wet etching process is performed to pattern the sacrificial layer 120, so that a sidewall of the sacrificial layer 120 is above the substrate 110 inside the P-type heavily doped regions 116. Specifically, when the sacrificial layer 120 includes the first dielectric layer 122 and the second dielectric layer 124, a wet etchant having a high etching selectivity to the second dielectric layer 124 may be selected. That is, a wet etchant that is easy to etch the second dielectric layer 124 but not easy to etch the first dielectric layer 122 and the substrate 110 may be selected to expose the first dielectric layer 122 below, and the vertical projection of the second dielectric layer 124 to the substrate 110 does not cover the P-type heavily doped region 116. The vertical projection of the second dielectric layer 124 to the substrate 110 and the P-type heavily doped region 116 have a distance therebetween. In this embodiment, the first dielectric layer 122 is still in place and is not etched. When the first dielectric layer 122 is silicon dioxide, and the second dielectric layer 124 is silicon nitride, the wet etchant may be hot phosphoric acid. Since the wet etchant does not etch the substrate 110 substantially, the doped region (such as P-type heavily doped region 116) on the substrate 110 is not damaged. The impact of wet etchant on the semiconductor device may be reduced.

When the sacrificial layer 120 is a single layer, a wet etchant having a high etching selectivity to the sacrificial layer 120 may be selected. That is, a wet etchant that is easy to etch the sacrificial layer 120 but not easy to etch the substrate 110 may be selected to etch the sacrificial layer 120 and expose the substrate 110 below. The sacrificial layer 120 does not cover the P-type heavily doped region 116. The vertical projection of the sacrificial layer 120 to the substrate 110 and the P-type heavily doped region 116 have a distance therebetween. In some embodiments, when the sacrificial layer 120 is silicon dioxide, the wet etchant may be hydrofluoric acid. When the sacrificial layer 120 is silicon nitride, the wet etchant may be hot phosphoric acid. Since the wet etchant does not etch the substrate 110 substantially, the doped region (such as P-type heavily doped region 116) on the substrate 110 is not damaged. The impact of wet etchant on the semiconductor device may be reduced.

Figure 5:
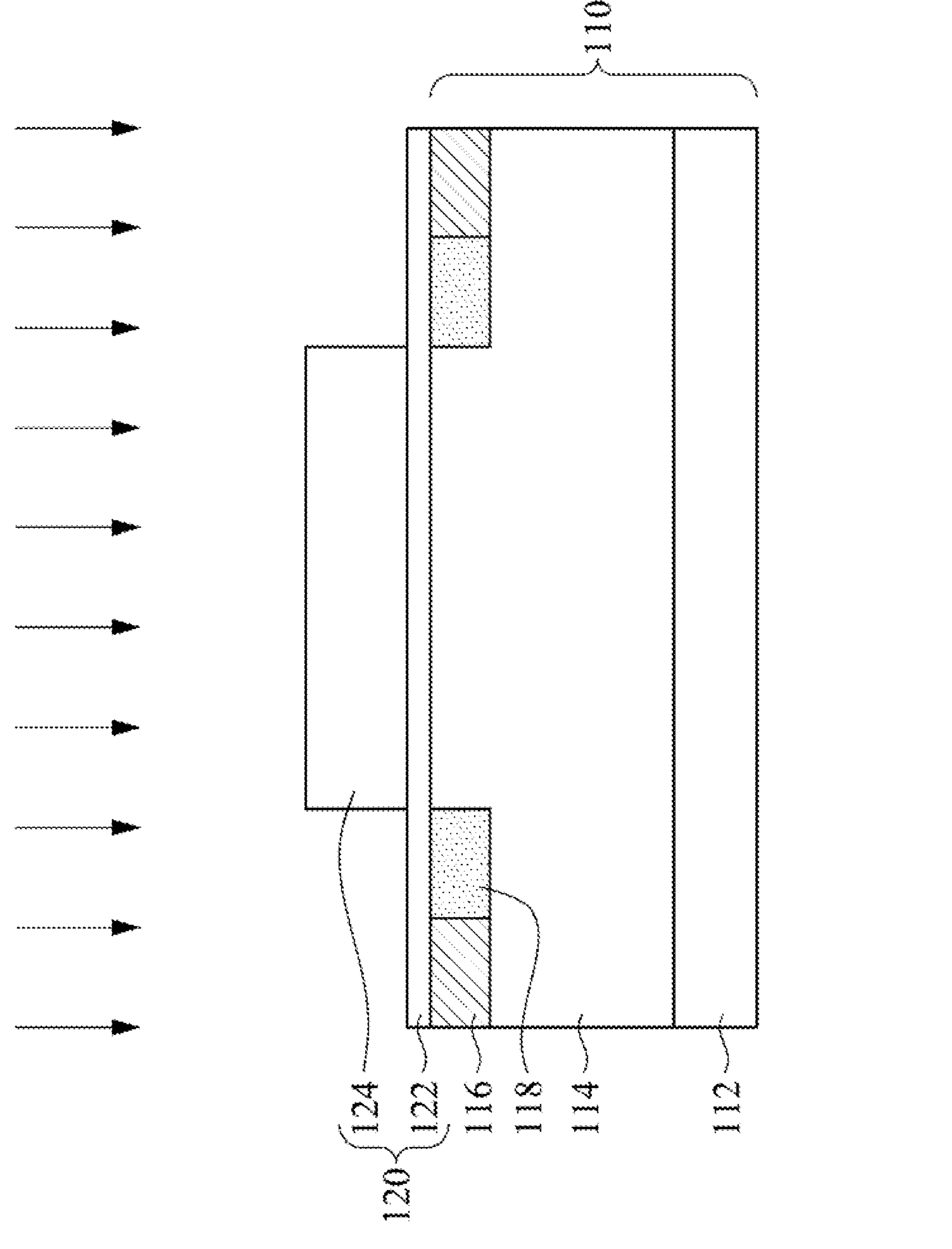

Referring to FIG. 5, N-type heavily doped regions 118 are formed in the substrate 110 by using the sacrificial layer 120 as mask. The N-type heavily doped region 118 is adjacent to the P-type heavily doped region 116. Specifically, an N-type heavy implantation may be performed to the substrate 110 to form the N-type heavily doped regions 118 in the substrate 110. When the sacrificial layer 120 includes the first dielectric layer 122 and the second dielectric layer 124, dopants may penetrate the first dielectric layer 122 and are implanted into the substrate 110. The N-type heavily doped region 118 is formed between the P-type heavily doped region 116 and the vertical projection of the second dielectric layer 124 to the substrate 110. The N-type heavily doped region 118 is substantially aligned with the sidewall of the second dielectric layer 124. When the sacrificial layer 120 is a single layer, the N-type heavily doped region 118 is formed between the P-type heavily doped region 116 and the vertical projection of the sacrificial layer 120 to the substrate 110. The N-type heavily doped region 118 is substantially aligned with the sidewall of the sacrificial layer 120. In some embodiments, the doping concentration of the N-type heavily doped region 118 is higher than the doping concentration of the epitaxial layer 114. In some embodiments, during forming the N-type heavily doped regions 118, a hard mask layer may be formed on the P-type heavily doped regions 116, so the P-type heavily doped regions 116 are not affected during forming the N-type heavily doped regions 118. Alternatively, the doping concentration of the P-type heavily doped region 116 may be increased in FIG. 2, so during forming the N-type heavily doped region 118, the ion concentration of the P-type heavily doped region 116 may be adjusted to the desired concentration.

Figure 6:
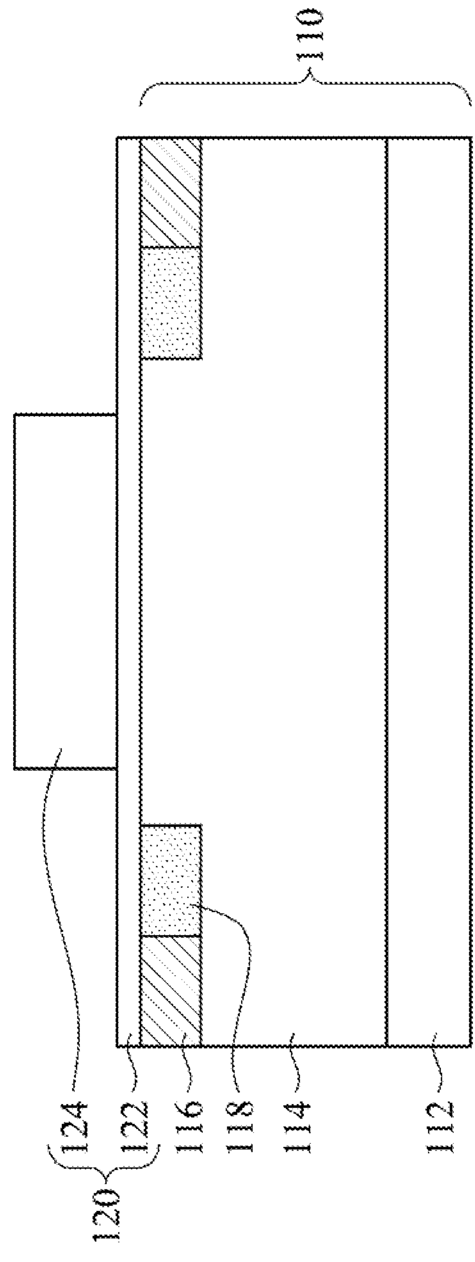

Referring to FIG. 6, a second wet etching process is performed to retract the sidewall of the sacrificial layer 120 to above the substrate 110 inside the N-type heavily doped regions 118. In some embodiments, the wet etchant used in the second wet etching process is same as the wet etchant used in the first wet etching process. Since the wet etchant does not etch the substrate 110 substantially, the doped region (such as P-type heavily doped region 116) on the substrate 110 is not damaged. The impact of wet etchant on the semiconductor device may be reduced. When the sacrificial layer 120 includes the first dielectric layer 122 and the second dielectric layer 124, the sidewall of the second dielectric layer 124 of the sacrificial layer 120 may be retracted, so that the vertical projection of the second dielectric layer 124 to the substrate 110 does not cover the N-type heavily doped regions 118. The vertical projection of the second dielectric layer 124 to the substrate 110 and the N-type heavily doped region 118 have a distance therebetween. In this embodiment, the first dielectric layer 122 is still in place and is not etched. When the sacrificial layer 120 is a single layer, the sidewall of the sacrificial layer 120 is retracted, so that the vertical projection of the sacrificial layer 120 to the substrate 110 does not cover the N-type heavily doped regions 118. The vertical projection of the sacrificial layer 120 to the substrate 110 and the N-type heavily doped region 118 have a distance therebetween.

In some embodiments, the retraction length of the sacrificial layer 120 may be precisely controlled by controlling the duration of the wet etching process. In some embodiments, during performing the second wet etching process, a duration of the second wet etching process is controlled based on a retraction level of the sidewall of the sacrificial layer 120. Since the etching rate of the wet etchant for the specific material is fixed (or calculable), the required etching duration may be calculated based on the desired retraction length. In some embodiments, the retraction length of the sacrificial layer 120 is between about 200 nm and 2000 nm.

Figure 7:
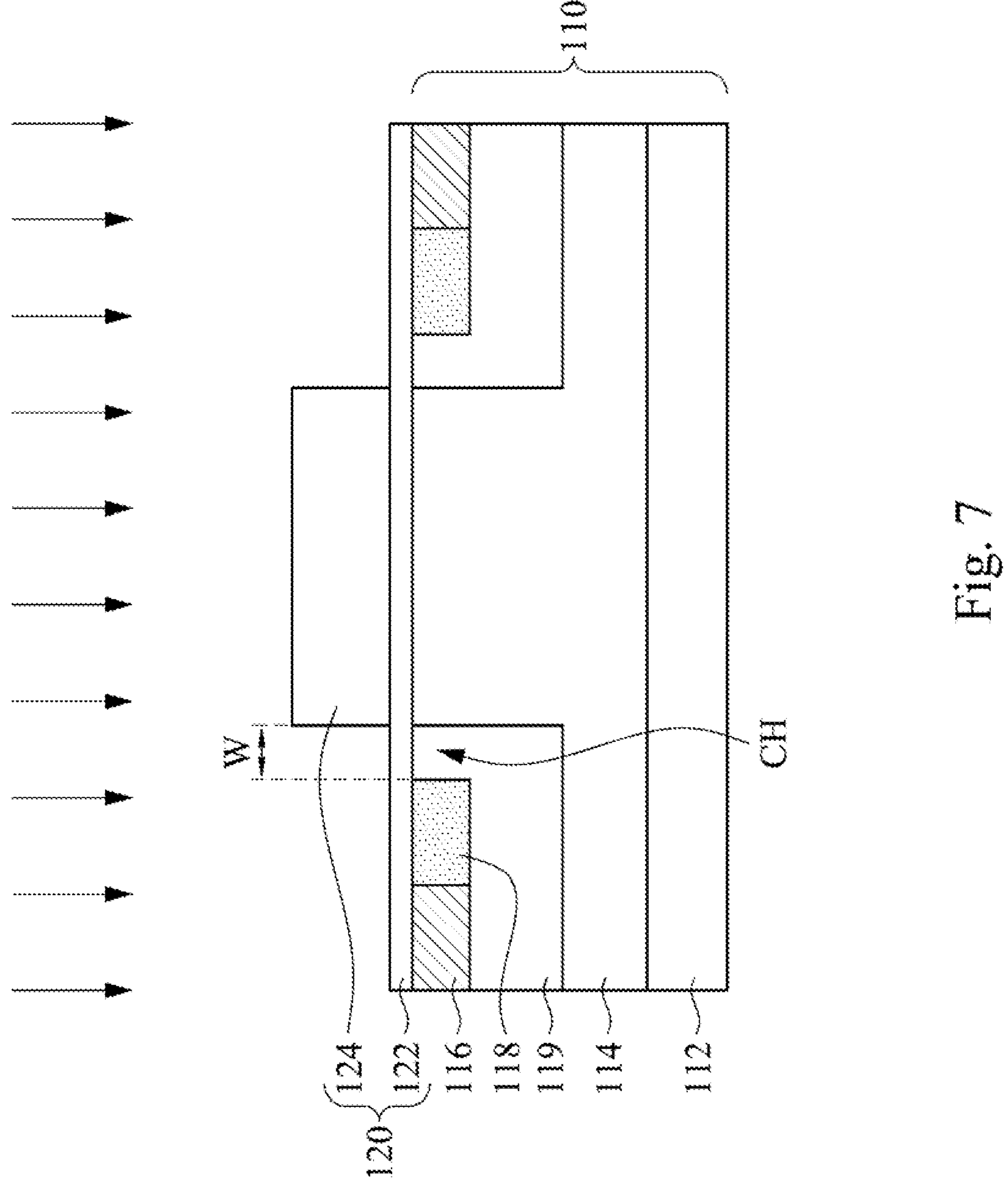

Referring to FIG. 7, P-type lightly doped regions 119 are formed in the substrate 110 by using the sacrificial layer 120 as mask. The P-type lightly doped region 119 is adjacent to the N-type heavily doped region 118, and is in contact with a bottom of the P-type heavily doped region 116 and a bottom of the N-type heavily doped region 118. Specifically, a P-type light implantation may be performed to the substrate 110 to form the P-type lightly doped regions 119 in the substrate 110. When the sacrificial layer 120 includes the first dielectric layer 122 and the second dielectric layer 124, the dopants may penetrate the first dielectric layer 122 and are implanted into the substrate 110. The P-type lightly doped region 119 is formed between the N-type heavily doped region 118 and the vertical projection of the second dielectric layer 124 to the substrate 110. The P-type lightly doped region 119 is substantially aligned with the sidewall of the second dielectric layer 124. When the sacrificial layer 120 is a single layer, the P-type lightly doped region 119 is formed between the N-type heavily doped region 118 and the vertical projection of the sacrificial layer 120 to the substrate 110. The P-type lightly doped region 119 is substantially aligned with the sidewall of the sacrificial layer 120.

The P-type lightly doped region 119 may include a channel region CH. The channel region CH is adjacent to the N-type heavily doped region 118, and the width W of the channel region CH is between 200 nm to 2000 nm. In some embodiments of the present disclosure, the P-type heavily doped regions 116 and the N-type heavily doped regions 118 are first formed, and then the P-type lightly doped regions 119 are formed. Therefore, the retraction length of the sacrificial layer 120 may be controlled by controlling the duration of the wet etching process precisely. Accordingly, the width W of the channel region CH of the P-type lightly doped region 119 is also be precisely controlled. As such, the width W of the channel region CH is controlled at the limited value of the semiconductor device, that is, at the minimum acceptable width W of the channel region CH. Therefore, the resistance contributed by the channel region CH is reduced, thereby reducing the overall resistance of the semiconductor device. Moreover, if the width W of the channel region CH is at the minimum acceptable width, the size of the semiconductor device may be reduced.

The P-type lightly doped region 119 further clads the P-type heavily doped region 116 and the N-type heavily doped region 118 at vertical direction. The breakdown voltage between the P-type lightly doped region 119 and the epitaxial layer 114 is higher than the breakdown voltage between the P-type heavily doped region 116 and the epitaxial layer 114. Therefore, when the P-type lightly doped region 119 clads the bottom of the P-type heavily doped region 116 and the bottom of the N-type heavily doped region 118, the semiconductor device may withstand higher voltage and is not easily damaged.

Figure 8:
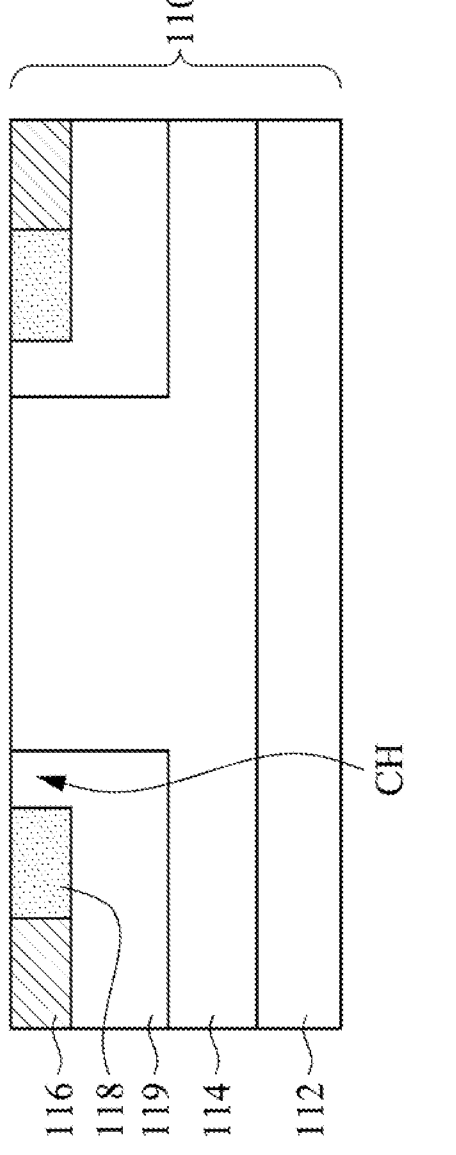

Referring to FIG. 8, after forming the P-type lightly doped regions 119, the sacrificial layer 120 is removed to expose other portions of the substrate 110. In some embodiments, the sacrificial layer 120 may be removed by dry etching, wet etching or combinations thereof. After removing the sacrificial layer 120, an annealing process is performed to the P-type heavily doped regions 116, the N-type heavily doped regions 118 and the P-type lightly doped regions 119 to repair the lattice defect of the doped regions of the substrate 110 (i.e. P-type heavily doped region 116, N-type heavily doped region 118 and P-type lightly doped region 119), and diffuse the dopants to the lattice substitution position of the substrate 110 to activate the dopant atom with semiconductor electrical properties.

Figure 9:
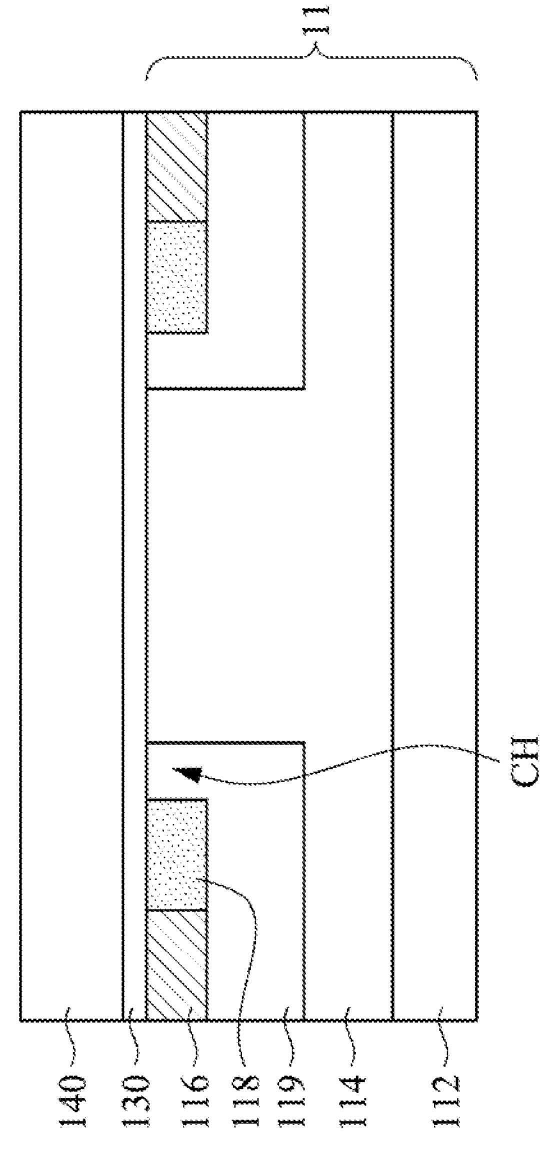

Referring to FIG. 9, a dielectric layer 130 is formed on the substrate 110, and a conductive layer 140 is formed on the dielectric layer 130. In some embodiments, the dielectric layer 130 may include silicon oxide, silicon nitride, silicon oxynitride, polysilicon, combinations thereof or the like. In some embodiments, the conductive layer 140 may include polysilicon, metal, metal compound, combinations thereof or the like.

Figure 10:
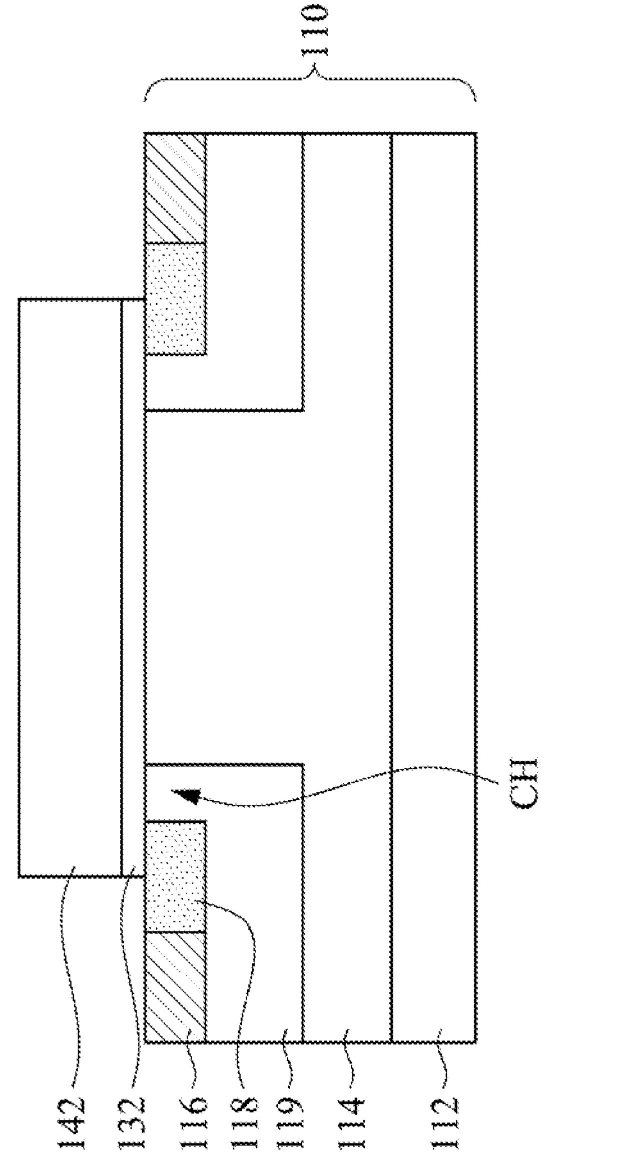

Referring to FIG. 10, the dielectric layer 130 and the conductive layer 140 is patterned to form a gate dielectric layer 132 and a gate layer 142 on the substrate 110. The conductive layer 140 may first be patterned to form the gate layer 142. Subsequently, the dielectric layer 130 is patterned by using the gate layer 142 as mask to form the gate dielectric layer 132. Therefore, the sidewall of the gate dielectric layer 132 and the gate layer 142 may be aligned with each other. The gate dielectric layer 132 is in contact with the N-type heavily doped regions 118, and the gate dielectric layer 132 covers the P-type lightly doped region 119 at the surface of the substrate 110. That is, the gate dielectric layer 132 may extend from one N-type heavily doped region 118 to another N-type heavily doped region 118.

Figure 11:
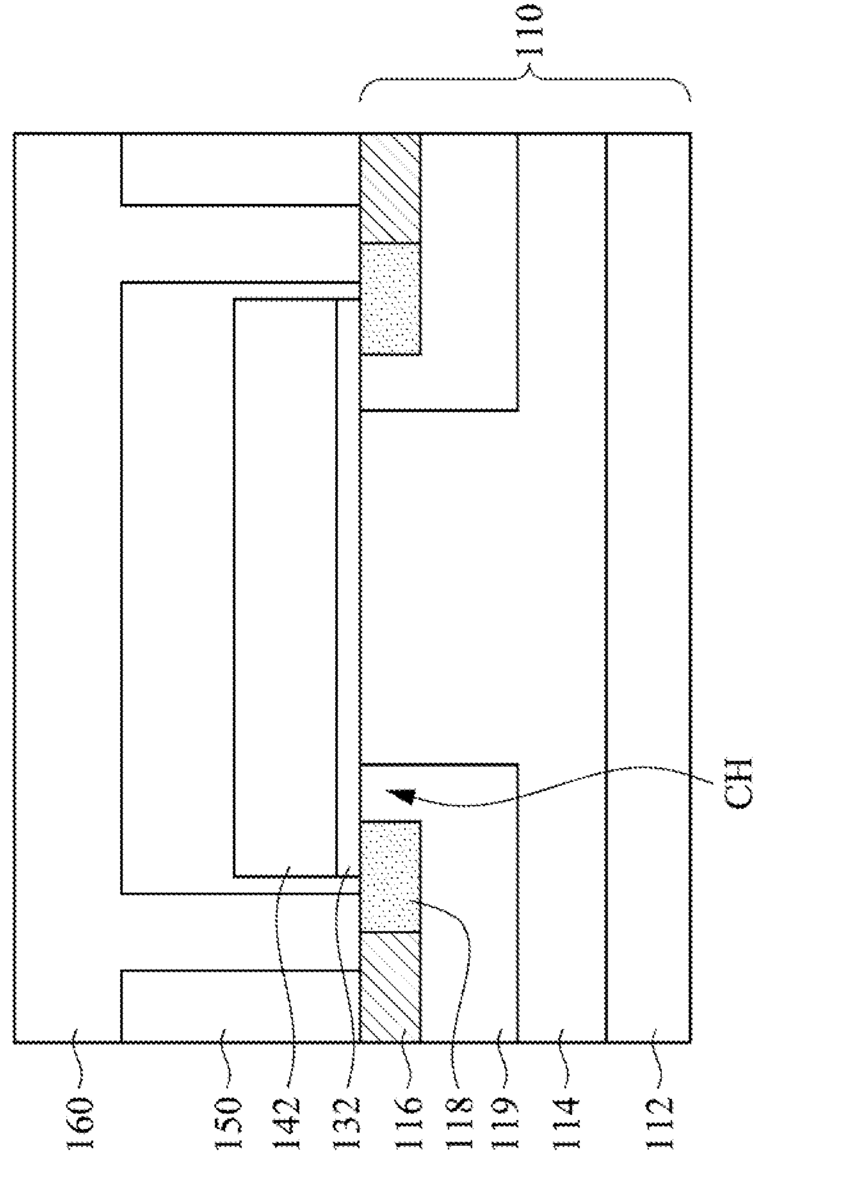
Figure 12:
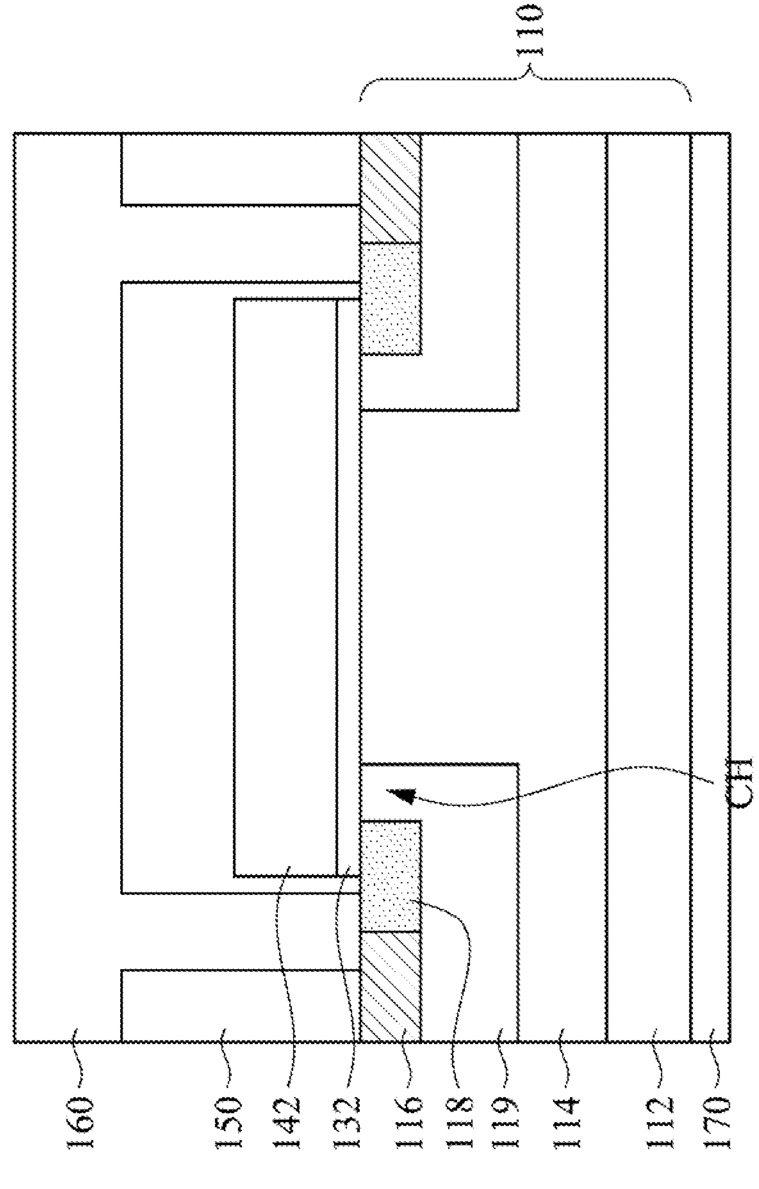

Referring to FIG. 11, a dielectric layer 150 is formed on the gate dielectric layer 132 and the gate layer 142. Subsequently, a source contact 160 is formed in the dielectric layer 150. Specifically, the dielectric layer 150 is first formed on the gate dielectric layer 132 and the gate layer 142, so that the dielectric layer 150 covers the gate dielectric layer 132, the gate layer 142 and the substrate 110. Subsequently, openings are formed in the dielectric layer 150, and the source contact 160 is formed in the openings. The source contact 160 is in contact with the P-type heavily doped regions 116 and the N-type heavily doped regions 118. Referring to FIG. 12, a drain electrode 170 may be formed under the substrate 110. The drain electrode 170 may be under the heavily doped layer 112 and is in contact with the heavily doped layer 112.

The resulting semiconductor device is shown in FIG. 12, semiconductor device includes the substrate 110, the P-type heavily doped regions 116, the N-type heavily doped regions 118, the P-type lightly doped regions 119, the gate dielectric layer 132 and the gate layer 142. The P-type heavily doped regions 116 are in the substrate 110. The N-type heavily doped regions 118 are in the substrate 110 and adjacent to the P-type heavily doped regions 116. The P-type lightly doped regions 119 are in the substrate 110 and clad the P-type heavily doped regions 116 and the N-type heavily doped regions 118. The gate dielectric layer 132 covers a portion of the P-type lightly doped regions 119. The gate layer 142 is on the gate dielectric layer 132.

The semiconductor device further includes the dielectric layer 150, the source contact 160 and the drain electrode 170. The dielectric layer 150 is on the substrate 110 and the gate layer 142. The source contact 160 is wrapped around by the dielectric layer 150, and in contact with the P-type heavily doped regions 116 and the N-type heavily doped regions 118. The drain electrode 170 is under the substrate 110.

As mentioned above, some embodiments of the present disclosure may be used to reduce the resistance of semiconductor devices, such as transistors. Specifically, the P-type heavily doped regions and the N-type heavily doped regions are first formed, and then the P-type lightly doped regions are formed. The channel length of the semiconductor device is precisely defined by precisely controlling duration of a wet etching process. Therefore, the limit value of the channel length is precisely defined to reduce the resistance of the semiconductor devices. Moreover, the P-type lightly doped regions clad the bottom of the P-type heavily doped regions and the bottom of the N-type heavily doped regions in some embodiments of the present disclosure, the semiconductor device may withstand higher voltage and is not easily damaged.

It is to be understood, however, that even though numerous characteristics and advantages of the present invention have been set forth in the foregoing description, together with details of the structure and function of the invention, and changes may be made in detail, especially in matters of shape, size, and arrangement of parts within the principles of the invention to the full extent indicated by the broad general meaning of the terms in which the appended claims are expressed.

What is claimed is:

1. A method of forming a semiconductor device, comprising:

forming a photoresist layer on a substrate;

forming a P-type heavily doped region in the substrate by using the photoresist layer as mask;

forming a sacrificial layer on the substrate and covering the P-type heavily doped region;

performing a first wet etching process to pattern the sacrificial layer, so that a sidewall of the sacrificial layer is above the substrate inside the P-type heavily doped region;

forming an N-type heavily doped region in the substrate by using the sacrificial layer as mask, wherein the N-type heavily doped region is adjacent to the P-type heavily doped region;

performing a second wet etching process to retract the sidewall of the sacrificial layer to the substrate inside the N-type heavily doped region;

forming a P-type lightly doped region in the substrate by using the sacrificial layer as mask, wherein the P-type lightly doped region is adjacent to the N-type heavily doped region, and is in contact with a bottom of the P-type heavily doped region and a bottom of the N-type heavily doped region; and removing the sacrificial layer.

2. The method of claim 1, wherein during performing the second wet etching process, a duration of the second wet etching process is controlled based on a retraction length of the sidewall of the sacrificial layer.

3. The method of claim 1, wherein forming a sacrificial layer on the substrate comprises:

forming a first dielectric layer on the substrate; and forming a second dielectric layer on the first dielectric layer, wherein the first dielectric layer and the second dielectric layer are made of different materials.

4. The method of claim 3, wherein performing the first wet etching process to retract the sidewall of the sacrificial layer comprises:

retracting a sidewall of the second dielectric layer to above the substrate inside the P-type heavily doped region.

5. The method of claim 4, wherein during forming the P-type lightly doped region, a dopant penetrates the first dielectric layer and is implanted into the substrate.

6. The method of claim 4, wherein during forming the N-type heavily doped region, a dopant penetrates the first dielectric layer and is implanted into the substrate.

7. The method of claim 4, wherein during the first wet etching process, the first dielectric layer is in place and a wet etchant in the first wet etching process does not etch the substrate.

8. The method of claim 4, wherein a retraction length of the second dielectric layer of the sacrificial layer is between about 200 nm and 2000 nm.

9. The method of claim 3, wherein during the second wet etching process, the first dielectric layer is in place and a wet etchant in the second wet etching process does not etch the substrate.

10. The method of claim 1, wherein an wet etchant used in the first wet etching process is same as an wet etchant used in the second wet etching process.

11. The method of claim 1, further comprising:

forming a dielectric layer on the substrate; and forming a conductive layer on the dielectric layer.

12. The method of claim 11, further comprising:

patterning the dielectric layer and the conductive layer to form a gate dielectric layer and a gate layer on the substrate, wherein the gate dielectric layer is in contact with the N-type heavily doped region.

13. The method of claim 12, further comprising:

forming a source contact in contact with the P-type heavily doped region and the N-type heavily doped region; and forming a drain electrode under the substrate.

14. The method of claim 1, further comprising:

after removing the sacrificial layer, an annealing process is performed to the P-type heavily doped region, the N-type heavily doped region and the P-type lightly doped region.

* * * * *